United States Patent [19]

Watanabe et al.

[11] 3,932,689

[45] Jan. 13, 1976

[54] FLEXIBLE ADHESIVE COMPOSITION AND METHOD FOR UTILIZING SAME AND ARTICLE FORMED THEREFROM

[75] Inventors: Tsutomu Watanabe; Sigenori Yamaoka; Kochi Tanaka, all of Yokohama, Japan

[73] Assignee: Sumitomo Bakelite Company, Limited, Tokyo, Japan

[22] Filed: Feb. 21, 1974

[21] Appl. No.: 444,263

[30]  Foreign Application Priority Data

Oct. 13, 1973   Japan.............................. 48-114353
Oct. 29, 1973   Japan.............................. 48-120736

[52] U.S. Cl. ................ 428/418; 156/330; 156/335; 174/68.5; 260/2 EC; 428/460; 428/461; 428/462; 428/474
[51] Int. Cl.².......................... C09J 3/14; C09J 3/16
[58] Field of Search ........... 156/330, 302, 303, 335; 161/184, DIG. 7; 174/68.5; 260/2 EA, 2 EC, 47 EA, 831, 837 R; 428/417, 418, 457, 460, 461, 462, 474

[56]  References Cited
UNITED STATES PATENTS

| | | | |
|---|---|---|---|
| 2,920,990 | 1/1960 | Been et al............................ | 161/184 |
| 3,450,595 | 6/1969 | Salter et al.......................... | 428/460 |
| 3,600,263 | 8/1971 | Lapitz................................. | 428/461 |
| 3,639,500 | 2/1972 | Muny et al....................... | 260/837 R |
| 3,686,045 | 8/1972 | Foster................................. | 156/53 |
| 3,709,840 | 1/1973 | Dehoff.............................. | 260/2 EC |
| 3,717,543 | 2/1973 | Sinclair et al....................... | 161/186 |
| 3,723,223 | 3/1973 | LeCompte.......................... | 156/313 |
| 3,732,332 | 5/1973 | Curtis et al...................... | 260/837 R |
| 3,759,777 | 9/1973 | Lubowitz et al.................... | 156/330 |
| 3,841,959 | 10/1974 | Mertens.............................. | 161/163 |

*Primary Examiner*—Douglas J. Drummond
*Assistant Examiner*—Jerome W. Massie
*Attorney, Agent, or Firm*—Karl W. Flocks

[57]  ABSTRACT

This invention provides an adhesive composition for use in flexible printed circuits, comprising a phenol-formaldehyde resin, a polyepoxy compound, an acrylonitrile-butadiene copolymer and/or a polyvinylacetal resin, and a styrenic copolymer containing as structural units maleic anhydride and/or an alkyl maleate. Being excellent in adhesive strength, flow property, rapid curability, and heat resistance after curing, the present composition is especially suitable for the continuous bonding of insulating plastic films, particularly a polyimide film, to conductor foils by use of a roll-laminator and gives heat-resistant metal-clad laminates excellent for flexible printed circuits which can be soldered at high temperatures. This invention further provides an adhesive composition having added thereto a compound consisting of an anhydride or a half-ester of cyclohexenepolycarboxylic acid in order to increase the flow property and adhesive strength of the adhesive composition at the time of bonding by means of a roll-laminator. All of the aforesaid adhesive composition not only permit the economical and technically advantageous production of laminates for heat resistant flexible printed circuits, but also can serve as an adhesive for either an overlay film for use in highly heat-resistant flexible printed circuits or an interlayer adhesive film.

30 Claims, No Drawings

FLEXIBLE ADHESIVE COMPOSITION AND METHOD FOR UTILIZING SAME AND ARTICLE FORMED THEREFROM

This invention relates to an adhesive composition for use in manufacturing a base board for flexible printed circuits, which has an excellent adhesive strength, heat resistance, chemical resistance, and electrical properties, and also has excellent laminating properties.

An object of this invention is to provide an adhesive suitable for manufacturing a laminate for flexible printed circuits having a strong adhesive strength and high heat resistance, by bonding to a metal foil a polyimide film as the insulating base material.

Another object of this invention is to provide an adhesive suitable for use in the continuous bonding of a heat-resistant plastic film, of which polyimide film is representative, to a web of metal foil by use of a roll-laminator.

A further object of this invention is to provide a highly heat-resistant adhesive suitable for such operations as bonding an insulating cover-lay to flexible printed circuits, multi-lamination of flexible printed circuits to one another, and bonding a flexible printed circuit to a rigid printed circuit.

With the progress of electronic and electric instrument industries in recent years, reduction in size and weight, high reliance of instruments for communications, industries, home appliances and the like and simplification of assembling system have been required, and a printed circuit board having a light and flexible plastic film as an insulating base board has been desired. Such plastic films for use as the insulating base board include polyester film, polyethylene film, polypropylene film, polyvinyl chloride film, polyimide film, etc., each of them having excellent characteristics. Among these materials, the polyimide film is remarkably excellent particularly in heat resistance and dimensional stability. If it is possible to bond a polyimide film to a metal foil and use the resulting assembly as the base board for flexible printed circuits, it is made possible to obtain a precise printed circuit which is required to have a high dimentional stability at the time of processing and said assembly may be suitable as a circuit board for the instruments to be operated under conditions which require high heat resistance. Further, in solder-connecting a printed circuit to other circuit boards, parts, and wirings, which is usually effected in assembling the printed circuit on instruments, it is difficult to apply a conventionally used eutectic solder to a usually used flexible printed circuit board based on a polyester film because said board is poor in heat resistance, whereas a flexible printed circuit board based on a polyimide film can be expected to have an advantage that the board can easily be subjected with high reliability to connecting at a temperature higher than the application temperature (260°C) of the eutectic solder.

On the other hand, however, the polyimide film is very difficult to bond to other materials because of its poor surface activity, and even if the film has been subjected to conventional surface treatments such as, for example, a treatment with a chromic acid-sulfuric acid mixture or corona discharge, and sanding, it has been difficult to obtain a strong adhesion to metal foils sufficient to meet the requirements for a printed circuit base board by use of a conventional adhesive. Moreover, it has been very difficult to find an adhesive which is resistant to severe chemical treatments in manufacturing the printed circuits and has a high heat resistance comparable to that of the polyimide film itself. Thus, there have been only a few adhesives which are satisfactory for the heat-resistant flexible printed circuits.

As a general method of bonding a plastic film to a metal foil, it is possible to adopt a method in which bonding is effected by use of a hot press for about 0.5 to 3 hours, similarly to the manufacture of conventional rigid laminates. However, since the starting materials are usually available in the form of webs, it is preferable to use a method called generally as "dry-lamination", in which the materials are coated with an adhesive and then bonded to one another by passing them through a pair of hot rolls. If this method is applicable also to the manufacture of laminates for use in flexible printed circuits, then the manufacturing course could be simplified, the production speed could be increased, and a continuous treating method could be applied to subsequent steps for manufacturing printed circuits, and hence, a great economical advantage could be obtained.

However, in order that such a laminating method using rolls can be adopted, there is required an adhesive which is curable in a time of only 0.5 to 5.0 sec. or so which is far shorter than that in the press method, and can impart to the resulting laminate important properties as printed circuits such as high adhesive strength, excellent chemical resistance, and excellent electrical properties. Also required for the adhesive are such delicate properties during the lamination procedure as non-blocking of the adhesive coated on the web and retention of sufficient flow property such that minute irregularities on the surface of a metal foil may be thoroughly covered. Since it is impossible for a unitary adhesive to fulfill such a variety of requirements, various adhesive resin compositions have so far been investigated. However, adhesive compositions applicable satisfactorily to the continuous lamination for flexible printed circuits are very few and an adhesive composition capable of being used for continuous lamination of a polyimide film to a metal foil and imparting high heat resistance to the laminate has never been found.

The resin compositions which can be used as an adhesive for ordinary printed circuit laminates include binary compositions such as a phenolic resin-nitrile rubber system and a phenolic resin-polyvinylacetal system, and three-component compositions such as a phenolic resin-epoxy resin-nitrile rubber system and a phenolic resin-epoxy resin-polyvinylacetal system. Although these compositions can be applied as an adhesive to conventional rigid base materials for printed circuits such as a paper-base copper-clad phenolic or epoxy laminate, they are unsatisfactory in the above-noted various required properties to be used in the flexible printed circuit laminate of a metal foil to a highly heat-resistant plastic film such as polyimide film. For instance, the phenolic resin-nitrile rubber system is inferior in heat resistance and in flow property during lamination; the phenolic resin-polyvinylacetal system is unsatisfactory in adhesive strength and flexibility; the said systems having additionally incorporated thereinto an epoxy resin have good flow property, but is still unsatisfactory in adhesive strength and heat resistance; and a phenolic resin-epoxy resin-nitrile rubber-polyvinylacetal four component system has favorable balanced characteristics, but can hardly withstand a temperature around 300°C, against which the polyimide film is able to resist. Moreover, because these systems have common defect of insufficient reactivity between the resin components, the application of any of these systems to the continuous roll-lamination method wherein bonding is effected only for a short period of time results in an insufficient curing of the adhesive layer, and hence, in fact, only a laminate inferior remarkably in chemical resistance and heat resistance is obtained.

This invention provides an adhesive composition which is freed from the above-said defects of conventional compositions, is suitable for use in continuous lamination method in which the materials are subjected to roll-to-roll lamination for a short period of time, gives a laminate which fully meets a variety of characteristics required for a flexible printed circuit base board and exhibits very excellent heat resistance.

The adhesive resin composition of this invention is prepared by incorporating at least one copolymer selected from the group consisting of copolymers of aromatic vinyl compounds with maleic anhydride (hereinafter referred to as copolymer A), partial alkyl esters of said copolymers (hereinafter referred to as copolymer B), copolymers of aromatic vinyl compounds with alkyl maleates (hereinafter) referred to as copolymer C), and copolymers of aromatic vinyl compounds with maleic anhydride and alkyl maleates (hereinafter referred to as copolymer D) into a mixture of a phenol-formaldehyde resin, a polyepoxy compound, and an acrylonitrile-butadiene copolymer and/or a polyvinylacetal resin.

The phenol-formaldehyde resin for use in this invention is a substantially fusible and soluble condensate (B-stage) obtained by reacting a phenol and formaldehyde using an acid or alkaline catalyst. The phenols include phenol, cresols, xylenols, alkylsubstituted phenols, Cashew oil, tung oil, and mixtures of these. The sources of formaldehyde include formalin, paraformaldehyde and trioxane. A small amount of curing agents such as hexamethylenetetramine may be used together with the phenol-formaldehyde condensate. These phenol resins are in nature good in electrical properties and also react with other components to contribute to making the adhesive composition heat resistant and chemical resistant. Among these phenol resins, the resol-type phenol resin obtained by using ammonia or an amine as catalyst is particularly preferred for use in the present adhesive composition, because said resin is excellent in flexibility, adhesive strength, and electrical properties, and good in compatibility and reactivity with epoxy resins, acrylonitrile-butadiene copolymers, and polyvinylbutyral resins. The molar ratio of formaldehyde to phenol in the reactant mixture to produce the resoltype resin is preferably in the range from 1.0 to 2.0.

The polyepoxy compounds for use in this invention are reactive polyepoxy or polyglycidyl compounds having at least two epoxy groups in the molecule. Examples of these compounds which may be used include conventional epoxy compounds such as diglycidyl ethers derived from bisphenols or halogenated bisphenols; cycloaliphatic polyepoxy compounds; glycidyl ethers of novolak resins, polyphenols, or polyhydroxyphenols; glycidyl ethers and esters derived from aromatic hydroxycarboxylic acids or aromatic dicarboxylic acids; glycidyl esters of dimer acids; and diglycidyl ethers of polyalkylene glycols. The epoxy equivalent may be about 100 to about 4,000, but preferably about 100 to about 1,000. If necessary, small amounts of low molecular weight monoepoxy compounds may be used together with the polyepoxy compound. These polyepoxy compounds impart to the adhesive composition the fluidity necessary when the composition is used in the short-time laminating by means of rolls, and improve the electrical properties and heat resistance of the composition by reacting with the phenolic resin and other components. Among the polyepoxy compounds, a polyether-type diepoxy compound obtained by condensation of an epihalohydrin and dihydric alcohol formed by reaction of a bisphenol or a halogenated bisphenol and an alkylene oxide in the presence of an alkaline or acidic catalyst is particularly preferred for use in combination with a phenolic resin and other components and also suitable for the adhesive composition for use in the short-time laminating by means of rolls, because said diepoxy compound is highly flexible, good in chemical resistance and heat resistance, and highly reactive.

The acrylonitrile-butadiene copolymers for use in this invention may be conventional ones. These copolymers impart to the present composition an excellent adhesiveness, improve the bond strength of the composition to the polyimide film and the metal foil, and enhance the flexibility. A high-nitrile copolymer containing 25 to 50% by weight of acrylonitrile is particularly preferred. Owing to the polarity of cyano groups, such a high-nitrile copolymer has a good compatibility with other resin components, a high adhesiveness, and little tendency to deteriorate the chemical resistance and heat resistance, said deterioration being a disadvantage of synthetic rubbers.

The polyvinylacetal resin to be used may be a polymer obtained by hydrolyzing polyvinyl acetate and then acetalizing the hydroxyl groups of the resulting polyvinyl alcohol with formaldehyde, acetaldehyde, butyraldehyde, etc. The thus obtained polyvinylacetals react with the polyepoxy compounds or phenol resins in the present composition to impart flexibility and adhesiveness to the present composition, and when used in combination with an acrylonitrile-butadiene copolymer, the polyvinylacetals improve the adhesive strength by synergistic effect of both polymers. Of these polyvinylacetals, those which have a relatively high mean degree of polymerization between 1,000 and 2,500 and have a good balance between the compatibility with other resin components and the heat resistance, and partially acetalized products thereof which have a degree of acetalization of 50 to 80 mole-% are particularly preferred because of their high reactivity with the phenol resins and polyepoxy compounds.

The copolymers A, B, C and D for use in this invention are high molecular weight curing agents having carboxyl groups or carboxylic anhydride groups in the molecule and each reacts with each of the phenolformaldehyde resin, epoxy compound, acrylonitrile-butadiene copolymer, and polyvinylacetal resin to form crosslinkages and accelerate the curing. When a crosslinking or curing agent of a low molecular weight is reacted with a phenol resin or an epoxy resin, usually, the crosslinking density tends to become very high, so the cured resin becomes poor in flexibility. If it is intended that the crosslinking density is kept low by use of such a low molecular weight curing agent, it follows that unreacted substances remain in the composition, which becomes susceptible to the attack of chemicals and solvents. On the contrary, with the said acid-based polymeric curing agents A, B, C and D for use in this invention, the completely cured product has sufficient flexibility because high molecular weight segments are present between the resulting crosslinkages, and also the cured product has excellent chemical resistance and heat resistance, because the curing agents per se are stable, high polymers. Therefore, the properties of the adhesive composition as a whole are kept from deterioration. Being highly reactive with each of the resin components, the said curing agent renders the adhesive composition so rapidly curable that the composition may be used in the short-time laminating of a plastic film and a metal foil by means of rolls, resulting in a highly heat-resistant cured product.

The aromatic vinyl compounds used in the copolymers A, B, C and D include, for example, styrene, styrene derivatives such as methylstyrene, dimethylstyrene, ethylstyrene, α-methylstyrene, α-methyl-p-isopropylstyrene, divinylbenzene, and the like and halogenated styrene derivatives, and copolymers comprising two or more aromatic vinyl compounds may also be used.

The copolymer A is obtained by copolymerization of such an aromatic vinyl compound with maleic anhydride, and preferably contains at least 30 mole percent of the maleic anhydride structural units in the molecule.

The copolymer B is obtained by partial esterification of the copolymer A with an aliphatic alcohol and may contain in the molecule such structural units as maleic anhydride, maleic acid, monoalkyl maleates, and dialkyl maleates, the copolymers preferred being those which have a degree of esterification of 50 mole percent or less based on the total maleic anhydride structural units contained in the copolymer.

The copolymer C is obtained by copolymerization of an aromatic vinyl compound with a monoalkyl maleate or of an aromatic vinyl compound with a monoalkyl maleate and a dialkyl maleate, the preferred copolymers being those containing in the molecule at least 30 mole percent of monoalkyl maleate structural units.

The copolymer D is obtained by copolymerization of an aromatic vinyl compound, maleic anhydride, and a monoalkyl maleate and/or a dialkyl maleate, the preferred copolymers being those containing in the molecule at least 30 mole percent of maleic anhydride structural units or at least 30 mole percent, in total, of the maleic anhydride units and the monoalkyl maleate units.

The alkyl groups of the alkyl maleates used in the copolymers B, C and D have preferably 1 to 20, more preferably 1 to 10, carbon atoms, and include specifically, methyl, ethyl, n-propyl, isopropyl, n-butyl, isobutyl, tert-butyl, n-pentyl, n-hexyl, tertamyl, n-heptyl, n-octyl, 2-ethylhexyl, n-nonyl, n-decyl, etc. Two or more alkyl groups may be present in the copolymers C and D.

In the present adhesive composition, the polyepoxy compound can sufficiently be cured by reacting with other components without using a curing agent for epoxy resins. However, it is possible, if necessary, to jointly use a conventional, active hydrogen-containing curing agent for epoxy resins, such as a polyamine, polycarboxylic acid or anhydride thereof, polyamide, dimercapto compound, imidazole derivative, or the like. Among these, particularly preferred are cyclohexenepolycarboxylic acid derivatives represented by the general formula E or F,

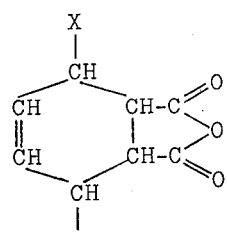
(E)

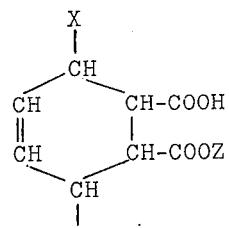
(F)

wherein X and Z are hydrogen atoms or alkyl groups having 1 to 10 carbon atoms, and Y is hydrogen atom, carboxyl group, or a carboxyalkyl group having 2 to 11 carbon atoms, because these compounds are able not only to accelerate the curing of polyepoxy compounds, but also to increase both the flow property of the present adhesive composition during the roll-laminating procedure and the adhesive strength. Examples of the compounds represented by the general formulas E and F include tetrahydrophthalic anhydride, monoisopropyl ester of tetrahydrophthalic acid, 3-n-heptyl-6-carboxyl-4-cyclohexene-1,2-dicarboxylic acid anhydride, mono-isopropyl ester of 3-n-heptyl-6-carboxyl-4-cyclohexene-1,2-dicarboxylic acid, 3-n-hexyl-6-carboxyethyl-4-cyclohexene-1,2-dicarboxylic acid anhydride, and mono-isobutyl ester of 3-n-hexyl-6-carboxyethyl-4-cyclohexene-1,2-dicarboxylic acid.

The compounding ratio of each of the aforesaid components is not particularly restricted, though the preferable ranges of each ratio based on the total weight of the resulting composition are 5 to 50% by weight concerning the phenol-formaldehyde resin, 5 to 70% by weight concerning the polyepoxy compound, 5 to 60% by weight concerning the acrylonitrile-butadiene copolymer and/or polyvinylacetal resin, 5 to 50% by weight concerning at least one copolymer selected from the group consisting of copolymers A, B, C and D, and 2 to 30% by weight concerning the derivative of cyclohexene-polycarboxylic acid represented by the general formula E or F, which is added if necessary. More preferable ranges are 10 to 40% by weight concerning the phenol-formaldehyde resin, 10 to 50% by weight concerning the polyepoxy compound, 15 to 50% by weight concerning the acrylonitrile-butadiene copolymer and/or polyvinylacetal resin, 10 to 30% by weight concerning the at least one copolymer selected from the group consisting of copolymers A, B, C and D, and 5 to 20% by weight concerning the derivative of cyclohexenepolycarboxylic acid represented by the general formula E or F, which is added if necessary.

The adhesive composition obtained by compounding the components in the aforesaid compounding ratios enables the heating time to be shortened when applied to a conventional pressing method. In addition, said adhesive composition has a sufficient flow property and rapid curing property to be applicable to the short-time bonding by means of rolls, which has been difficult with conventional adhesives, and after having been cured shows highly balanced characteristics with respect to adhesive strength, heat resistance, chemical resistance, flexibility, and electrical properties. Even compositions obtained using ratios outside the above ranges can also show considerably stable performance owing to synergistic effect of the components over a considerably wide range. It seems that the rapid curing property and high heat resistance of the adhesive composition of this invention depends largely on high reactivity of the high polymer curing agent with other components and on the chemical stability of each component, said high polymer curing agent being the copolymer A, B, C or D containing structural units of maleic anhydride or a monoalkyl maleate.

As mentioned above, the adhesive composition of this invention has fundamental properties required for an adhesive for the flexible printed circuit laminate. It may be possible to add thereto curing or crosslinking agents, flexibility enhancing agents, fire retardants, fillers, and colorants, in such small amounts that said fundamental properties are not deteriorated.

In using the present adhesive composition as an adhesive, the concentration of the composition is adjusted to a concentration suitable for coating a web, by use of a common solvent, such as acetone, methyl ethyl ketone, toluene, xylenes, dimethylformamide, tetrahydrofuran, dioxane, methyl Cellosolve, or mixtures of these compounds.

Bonding a plastic film to a metal foil by use of the resulting adhesive can be carried out according to a conventional bonding method by means of a coating and drying equipment and a hot-press, though the most commercially advantageous method is a method of bonding in the form of web by means of a roll-laminator. The present adhesive composition is most suitable for such a continuous laminating method.

The above bonding method comprises the steps of applying the present adhesive composition dissolved in a solvent to a plastic film and/or a metal foil in the form of web at the coating roll section of a roll-laminator, evaporating the solvent in the drying zone to bring the adhesive composition to a semi-hardened state; heating and bonding the plastic film and the metal foil at the pressing roll section while passing them in close contact with each other through the press-roll section, and winding the resulting laminate on a reel. A series of these steps run continuously by interlocking every roll of the whole equipment. With such an equipment, in order to fully utilize the adhesive properties of the present adhesive and to meet the severe characteristics required for the flexible printed circuit base board, it is preferable to use pressing rolls consisting of a metal roll such as steel roll and a rubber roll such as a silicone roll and to pass a plastic film and a metal foil through the pressing rolls in such a manner that the plastic film and the metal foil are brought into contact, respectively, with the metal roll and the rubber roll and that the metal foil is allowed to wrap the rubber roll from the position on the circumference of the rubber roll for $\pi/4$ or more radians toward the contact line of both rolls. This method is highly advantageous for the continuous laminating method using the present adhesive composition because the formation of wrinkles at the bonded portion resulting mainly from the thermal expansion of the highly rigid metal foil is prevented, and simultaneously, the continuous heating of the metal foil which passes through the pressing rolls within a short time results in an enhancement of the effect of heat-transfer to the adhesive and in an acceleration of the melting, adhesion and curing of the adhesive, to impart a high adhesion, excellent chemical resistance, and other favorable performance to the laminated product.

The adhesive layer of the laminate, which is obtained by bonding with the present adhesive composition a plastic film to a metal foil by either the roll method or the press method, is insoluble in organic solvents for use in preparing the printed circuits such as methyl ethyl ketone, trichloroethylene, methylene chloride, acetone, methanol, toluene, and xylene, and also resistant against attack of such chemicals as a 10%-aqueous hydrochloric acid, 10%-aqueous sodium hydroxide solution, and 10%-aqueous ammonium persulfate solution so that the adhesive layer withstand successfully an ordinary series of treatments such as coating an etching resist on the laminate and developing the resist, etching a conductor foil, plating, removing the resist, etc. The adhesive layer is also excellent in flexibility and in electrical properties and does not impair the characteristics of the base film for flexible printed circuits. Further, the adhesive strength and heat resistance of the adhesive layer offer safety and reliability when the finished printed circuits are assembled in instruments and during a long service period of the assembled printed circuits.

Although the adhesive composition of this invention is applicable to such films as polyester film, polyvinyl chloride film, etc., which are usually used as the base board for flexible printed circuits, its advantage is manifested to the maximum extent when applied to the combinations of highly heat-resistant plastic films such as polyimide, polyamide-imide, and polyester-imide films with conductor foils such as copper, aluminum, tin, and beryllium-copper films. Particularly when a polyimide film, such as a film of polypyromellitimide (for example, Kapton, a registered trademark of Du Pont Co.) obtained by polycondensation or aromatic pyromellitic acid with an aromatic diamine, and a conductor foil are bonded through the interposed adhesive composition of this invention, the resulting laminate, including the adhesive layer, shows heat resistance at nearly 300°C. Thus, it is possible to obtain a laminate of the supreme quality as a base board for flexible printed circuits, which has a distinguished feature of being able to permit a soldering-joint at a temperature of 260°C or higher by use of a eutectic solder, such soldering being impossible with a conventional laminate of plastic film to metal foil, and, moreover, has excellent primary characteristics such as adhesive strength, flexibility, chemical resistance, dimentional stability, and electrical properties. The present adhesive composition makes possible to manufacture such a type of laminate from polyimide film and metal foil by a continuous method based on the roll-to-roll system which is a commercially most advantageous method for manufacturing a heat resistant laminate for flexible printed circuits.

Furthermore, being excellent in heat resistance, adhesiveness, flow property, and electrical properties, the adhesive composition of this invention is suitable as an adhesive layer for a film cover-lay which is usually applied for the purpose of insulation, corrosion inhibition, and crease protection of the conductor in a flexible printed circuit. The adhesive composition is coated on polyester film, polyimide film, etc., and used in the cover-lay step by use of rolls or a press to give a covered printed circuit suitable for solder-connecting.

The adhesive composition of this invention is also suitable as an adhesive or as a film adhesive for use in backing of a flexible printed circuit with a rigid laminate for the purpose of reinforcing the parts-loading position, in integral lamination of a rigid printed circuit to a flexible printed circuit which is effected for the purpose of simplification of connection; and in multi-lamination of flexible printed circuits to one another which is effected for the purpose of formation of a high density wiring of circuit. The quality required for this kind of printed circuit is sufficiently satisfied by the adhesive property, flow property, and heat resistance of the adhesive composition of this invention.

The invention is illustrated below in detail with reference to Examples, but the invention is not limited to the Examples.

EXAMPLE 1

Twenty-five parts by weight of a phenolic resin obtained by reacting formaldehyde and phenol in 1.2:1.0 molar ratio, using 2 PHR of a 25%-aqueous ammonia solution as catalyst, 50 parts by weight of a diepoxy compound having an epoxy equivalent of 340 and obtained by the condensation of epichlorohydrin and a dihydric alcohol formed by reacting bisphenol-A and propylene oxide using potassium hydroxide as catalyst, 40 parts by weight of an acrylonitrile-butadiene copolymer containing 30% by weight of acrylonitrile, 10 parts by weight of a styrene-$\alpha$-methylstyrene-maleic anhydride copolymer containing 45 mole percent of maleic anhydride, and 50 parts by weight of an isobutyl maleate-dimethylstyrene copolymer containing 55 mole percent of isobutyl maleate were dissolved in methyl ethyl ketone and mixed to prepare an adhesive varnish of a concentration of 25%. The adhesive thus obtained was coated on a polyimide film (Kapton, a registered trademark of Du Pont Co.) 50 $\mu$ in thickness, to a thickness of about 30 $\mu$ by means of a roll-laminator in which a coating roll section, a drying zone, and a pressing roll section are connected in series. After having been dried at 130°C for 5 minutes, the coated film was adhered to a copper foil having a thickness of 35 $\mu$ by pressing them at 170°C at a pressure of 20 kg/cm² between the pressing rolls consisting of a metal roll and a rubber roll while passing the film and the copper foil through between the pressing rolls in such a manner that the coated film and the copper foil were contacted, respectively, with the metal roll and the rubber roll, and the copper foil was allowed to wrap the rubber roll from the position on the circumference of the rubber roll for 2/5 $\pi$ radians toward the contact line of both rolls, to form a flexible, copper-clad laminate.

As shown in Table 1, in spite of the short-time bonding at a low pressure, the resulting flexible copper-clad laminate was excellent in bond strength, chemical resistance, and electrical properties, and outstanding in heat resistance, withstanding 60 seconds immersion in a solder bath at 280°C, that is, practically withstanding a temperature of 300°C. To the contrary, when a conventional adhesive was used and bonding was carried out by means of a roll-laminator for a short period of time (Comparative Examples 1 to 5), the resulting laminate was not sufficiently cured and its chemical resistance, heat resistance, and bond strength were unsatisfactory for practical use; even when bonding was carried out for a long period of time by means of a press, the resulting laminate was far inferior in soldering heat-resistance and no sufficient performance was obtained.

EXAMPLE 2

In a manner similar to that in Example 1, the components given below were dissolved in tetrahydrofuran and mixed to prepare an adhesive varnish of 20% concentration.

| | | Part by weight |
|---|---|---|
| 1. | Phenol-formaldehyde resin (the same as used in Ex. 1) | 30 |
| 2. | Diepoxy compound (diglycidyl ether of the adduct of bisphenol-A and ethylene oxide in molar ratio of ½) | 50 |
| 3. | Polyvinylbutyral resin (mean degree of polymerization, 1900; degree of butyralization, 75 mole-%) | 40 |
| 4. | Maleic anhydride-styrene (50:50 mole-%) copolymer | 30 |
| 5. | n-Propyl maleate-dimethylstyrene (55:45 mole-%) copolymer | 30 |

The resulting adhesive was coated on a polyamide-imide film, 50 $\mu$ in thickness (Pyrodic, a trade name of Dainippon Ink and Chemicals, Inc.), to a thickness of about 30 $\mu$. After having been dried at 120°C for 5 minutes, the coated film was adhered to a copper film, 35 $\mu$ in thickness, by passing the two through between the pressing rolls at 160°C in 1.5 seconds under a pressure of 20 kg/cm² in the same manner as in Example 1 to prepare a flexible copper-clad laminate.

As shown in Table 1, in spite of the short-time bonding, the resulting laminate was excellent in all properties and permitted the use of an ordinary eutectic solder, though the soldering heat-resistance was dependent on heat resistance limit of the film itself.

EXAMPLE 3

Sixty parts by weight of a cresol resin obtained by reacting formaldehyde and cresol in 1.5:1.0 molar ratio, using 5 PHR of triethylamine as catalyst, 20 parts by weight of a brominated bisphenol-A-based diepoxy compound (Epikote 1045, a trademark of Shell Chemical Corp.), 80 parts by weight of an acrylonitrile-butadiene copolymer containing 25% by weight of acrylonitrile, and 20 parts by weight of a maleic anhydride-dimethylstyrene copolymer containing 60 mole percent of maleic anhydride were dissolved in a solvent mixture of toluene and methyl Cellosolve to prepare an adhesive varnish of a concentration of 30%. The varnish obtained was coated on a polyimide film, 75 $\mu$ in thickness, to a thickness of about 30 $\mu$. After having been dried at 150°C for 7 minutes, the coated film was adhered to an aluminum foil, 40 $\mu$ in thickness, by passing the two through between the pressing rolls at 180°C in 3 seconds under a pressure of 25 kg/cm² in the same manner as in Example 1. As shown in Table 1, the flexible aluminum-clad laminate was excellent in all properties in spite of the shorttime bonding. Particularly, the laminate was outstanding in soldering heat-resistance and permitted the polyimide film to manifest its inherent characteristics to full extent.

EXAMPLE 4

Ten parts by weight of the cresol-formaldehyde resin used in Example 3, 50 parts by weight of a novolak-type epoxy compound (Epikote 154, a trademark of Shell Chemical Corp.), 60 parts by weight of an acrylonitrile-butadiene copolymer containing 45% by weight of acrylonitrile, 30 parts by weight of a polyvinylbutyral resin having a mean degree of polymerization of 1,100 and a degree of butyralization of 60 mole percent, and 40 parts by weight of a half-esterified product of a maleic anhydride-styrene copolymer containing 50 mole percent of maleic anhydride with n-pentyl alcohol were dissolved in a toluene-acetone solvent mixture to prepare an adhesive varnish of a concentration of 30% by weight. The adhesive obtained above was coated on a polyethylene 2,6-naphthalate film, 50 $\mu$ in thickness, to a thickness of about 20 $\mu$. After having been dried at 110°C for 6 minutes, the coated film was adhered to a copper foil, 35 $\mu$ in thickness, by passing the two through between pressing rolls at 150°C in 2 seconds under a pressure of 15 kg/cm$^2$ in the same manner as in Example 1. As shown in Table 1, the resulting flexible copperclad laminate was excellent in all properties and particularly its soldering heat-resistance was sufficient for the use of an ordinary eutectic solder, though the resistance depends upon the heat resistance limit of the film itself.

EXAMPLE 5

In the same manner as in Example 1, the components given below were dissolved in a solvent mixture of methyl ethyl ketone and methyl Cellosolve to prepare an adhesive varnish of a concentration of 17%.

| | Part by weight |
|---|---|
| 1. Cresol-formaldehyde resin (the same as used in Example 3) | 20 |
| 2. Bisphenol-based diepoxy compound (Epikote 828 produced by Shell Chem. Corp.) | 80 |
| 3. Acrylonitrile-butadiene copolymer (containing 30% by weight of acrylonitrile) | 20 |
| 4. Polyvinylbutyral resin (mean degree of polymerization, 2,200; degree of butyralization, 50 mole-%) | 10 |
| 5. Post-esterified product of a maleic anhydride-styrene (50:50 mole-%) copolymer with isopropyl alcohol | 60 |
| 6. Tetrahydrophthalic anhydride | 10 |

The resulting adhesive varnish was coated on a polyimide film, 25 $\mu$ in thickness, to a thickness of about 15 $\mu$. After having been dried at 160°C for 3 minutes, the coated film was adhered to a copper foil, 17.5 $\mu$ in thickness, by passing the two through between pressing rolls in one second at 170°C and 20 kg/cm$^2$ in the same manner as in Example 1 to prepare a flexible copper-clad laminate. As shown in Table 1, in spite of the short-time bonding, the laminate was excellent in all properties, and particularly the soldering heat-resistance was outstanding.

COMPARATIVE EXAMPLE 1

Fifty parts by weight of a phenolic resin obtained by reacting formaldehyde and phenol in 2.0:1.0 molar ratio, using 3 PHR of a 25%-aqueous ammonia solution as catalyst and 50 parts by weight of an acrylonitrile-butadiene copolymer containing 30% by weight of acrylonitrile were dissolved in an acetone-toluene solvent mixture to prepare an adhesive varnish of a concentration of 30%. The adhesive varnish thus obtained was coated on a polyimide film, 50 $\mu$ in thickness, to a thickness of about 30 $\mu$ and dried at 130°C for 5 minutes. In the same manner as in Example 1, the coated film was adhered to a copper foil, 35 $\mu$ in thickness, by passing the two through between the pressing rolls of a roll-laminator within 2 seconds, at 170°C and 2 kg/cm$^2$. It was found that the polyimide film and the copper foil had been hardly bonded owing to poor flow of the adhesive. On the other hand, the above-said coated film and the copper foil, 35 $\mu$ in thickness, were placed one over the other, interposed between two stainless steel plates, and pressed by means of a hot press at 170°C, and a pressure of 80 kg/cm$^2$ for 120 minutes. It was found that the laminate thus obtained had very inhomogeneous adhesive layer which resulted in inhomogeneous bonding and inferior resistance of the laminate against chemicals and heat, as shown in Table 2.

COMPARATIVE EXAMPLE 2

An adhesive varnish, 25% in concentration, was prepared by dissolving in methyl ethyl ketone the same components in the same ratios as in Example 1, except that 10 parts by weight of menthanediamine was used in place of the maleic anhydride-$\alpha$-methylstyrene copolymer and the isobutyl maleate-dimethylstyrene copolymer. In the same manner as in Example 1, the adhesive varnish thus obtained was coated on a polyimide film and dried, and the coated film was bonded to a copper foil, 35 $\mu$ in thickness, by means of a roll-laminator. It was found that the resulting laminate had an insufficiently cured adhesive layer, and was subject to attack of the solvents such as tri-chloroethylene, acetone, and the like. On the other hand, in the same manner as in Comparative Example 1, the said coated film was bonded to a copper foil 35 $\mu$ in thickness, by means of a hot press under application of heat and pressure. The laminate thus obtained had still unsatisfactory heat resistance, as shown in Table 2.

COMPARATIVE EXAMPLE 3

An adhesive varnish of 20% concentration was prepared by dissolving and mixing in tetrahydrofuran the same components in the same ratios as in Example 2, except that 10 parts by weight of menthanediamine was used in place of the maleic anhydride-styrene copolymer and the isobutyl maleate-dimethylstyrene copolymer. In the same manner as in Example 2, the adhesive varnish thus obtained was coated on a polyamide-imide film, 50 $\mu$ in thickness, and after having been dried the coated film was bonded to a copper film, 35 $\mu$ in thickness, by means of a roll-laminator. It was found that the resulting laminate had an insufficiently cured adhesive layer, and was subject to attack of the solvents such as trichloroethylene, acetone, and the like. On the other hand, in the same manner as in Comparative Example 1, the said coated film was boned to a copper foil, 35 $\mu$ in thickness, by means of a press under application of heat and pressure. The laminate thus obtained had still unsatisfactory heat resistance, as shown in Table 2.

COMPARATIVE EXAMPLE 4

An adhesive varnish of 20% concentration was prepared by dissolving and mixing in tetrahydrofuran 60 parts by weight of the same cresol-formaldehyde resin as used in Example 3 and 40 parts by weight of the same polyvinyl acetal resin as used in Example 2. The adhesive thus obtained was coated on a polyimide film, 50 $\mu$ in thickness, to a thickness of about 25 $\mu$ and dried at 120°C for 7 minutes. In the same manner as in Example 1, the coated film obtained was adhered to a copper foil, 35 $\mu$ in thickness, by passing the two through between the pressing rolls of a roll-laminator at 160°C in 2 seconds under a pressure of 25 kg/cm². It was found that the adhesive layer of the resulting laminate was subject to attack of the solvents such as trichloroethylene and acetone. On the other hand, in the same manner as in Comparative Example 1, the said coated film was bonded to a copper foil, 35 $\mu$ in thickness, by means of a press under application of heat and pressure. The laminate obtained was found to be inferior in such properties as heat resistance, adhesive strength, and flexibility, as shown in Table 2.

COMPARATIVE EXAMPLE 5

An adhesive varnish of 20% concentration was prepared by dissolving and mixing in methyl ethyl ketone 50 parts by weight of the same cresol-formaldehyde resin as used in Example 3, 10 parts by weight of the same bisphenol-based diepoxy compound as used in Example 5, 80 parts by weight of an acrylonitrile-butadiene copolymer containing 30% by weight of acrylonitrile, and 30 parts by weight of a polyvinylbutyral resin having a degree of polymerization of 1,500 and a degree of butyralization of 70 mole percent. The adhesive varnish thus obtained was coated on a polyimide film, 50 $\mu$ in thickness, to a thickness of about 30 $\mu$ and dried at 130°C for 5 minutes. The resulting coated film and a copper foil, 35 $\mu$ in thickness, were placed one over the other and bonded in the same manner as in Comparative Example 1 by application of heat and pressure by means of a hot press. As shown in Table 2, the resulting laminate had fairly balanced properties but had somewhat limited heat resistance. On the other hand, in the same manner as in Example 1, the said coated film was bonded to a copper foil by means of a roll-laminator. The resulting laminate had an insufficiently cured adhesive layer and was unsatisfactory for practical use in such properties as chemical resistance, heat resistance, and adhesive strength.

EXAMPLE 6

In the same manner as in Example 1, an adhesive varnish of 25% concentration was prepared by dissolving and mixing in methyl ethyl ketone the following components.

| | Part by weight |
|---|---|
| 1. Novolak-type phenol-formaldehyde resin (PR-317, a trade name of Sumitomo Durez Co.) | 50 |
| 2. Cycloaliphatic diepoxy compound (Chissonox 221, a trade name of Chisso Co.) | 40 |
| 3. Acrylonitrile-butadiene copolymer (containing 45% by weight of acrylonitrile) | 60 |
| 4. Maleic anhydride-styrene-dimethyl-styrene (50:30:20 mole percent) copolymer | 20 |
| 5. Isobutyl 3-n-hexyl-6-carboxyethyl-4-cyclohexene-1,2-dicarboxylate | 30 |

In the same manner as in Example 1, the adhesive varnish thus obtained was coated on a polyimide film, 125 $\mu$ in thickness, and the coated film was bonded to an aluminum foil, 160 $\mu$ in thickness, to obtain a flexible aluminum-clad laminate, the properties of which were as shown in Table 1.

EXAMPLE 7

In the same manner as in Example 1, an adhesive varnish having a concentration of 30% was prepared by dissolving and mixing in tetrahydrofuran the following components.

| | Part by weight |
|---|---|
| 1. Resol-type phenol-formaldehyde resin (PR 11078, a trade name of Sumitomo Durez Co.) | 40 |
| 2. Ether-ester-type diepoxy compound (Epiclon 1030, a trade name of Dainippon Ink and Chemical Co.) | 40 |
| 3. Polyvinylformal resin (mean degree of polymerization, 2,400; degree of formalization, 80%) | 80 |
| 4. Maleic anhydride-ethyl maleate-styrene (30:20:50 mole percent) copolymer | 30 |
| 5. Isobutyl-3-n-heptyl-6-carboxy-4-cyclohexene-1,2-dicarboxylate | 10 |

In the same manner as in Example 1, the adhesive varnish obtained was coated on a polyethylene terephthalate film, 100 $\mu$ in thickness, and the coated film was bonded to a copper foil, 70 $\mu$ in thickness, by application of heat and pressure by means of a roll-laminator to obtain a flexible copper-clad laminate, the properties of which were as shown in Table 1.

EXAMPLE 8

In the same manner as in Example 1, an adhesive varnish having a concentration of 35% was prepared by dissolving and mixing in methyl isobutyl ketone the following components.

| | Part by weight |
|---|---|
| 1. Cashew oil-modified phenol-formaldehyde resin (PR-12987, a trade name of Sumitomo Durez Co.) | 30 |
| 2. Bisphenol-based diepoxy compound (Epikote 1007, a trade name of Shell Chemical Corp.) | 100 |
| 3. Acrylonitrile-butadiene copolymer (containing 25% by weight of acrylonitrile) | 25 |
| 4. Polyvinylacetal resin (mean degree of polymerization, 1.500; degree of acetalization, 55 mole percent) | 15 |
| 5. n-Hexyl maleate-di-n-hexyl maleate-styrene (30:20:50 mole-%) copolymer | 50 |

In the same manner as in Example 1, the adhesive varnish thus obtained was coated on a polyimide film, 125 $\mu$ in thickness, and the coated film was bonded to a nichrome foil, 60 $\mu$ in thickness, by application of heat and pressure by means of a roll-laminator to obtain a flexible nichrome-clad laminate, the properties of which were as shown in Table 2.

EXAMPLE 9

The adhesive varnish obtained in Example 8 was coated on a nichrome foil, 60 $\mu$ in thickness, to a thickness of about 30 $\mu$ and dried at 130°C for 5 minutes. The resulting coated foil and a polyimide film, 125 $\mu$ in thickness, were placed one over the other, interposed between two stainless steel plates, and pressed by means of a hot press at 170°C, under a pressure of 100 kg/cm$^2$, for 40 minutes. The properties of the resulting laminate were as shown in Table 2. As seen from Table 2, the adhesive composition of this invention is applicable not only to the bonding by the roll method, but also to the bonding by the press method, giving a laminate with excellent properties.

EXAMPLE 10

By use of the laminate obtained in Example 1, a flexible printed circuit with a circular land area was prepared by the etching method. Separately, the same adhesive is used in Example 2 was coated on a polyimide film, 25 $\mu$ in thickness, and dried at 120°C for 5 minutes, after which areas corresponding to the land were punched off from the film. The thus obtained film was placed over the printed circuit in a registered position, and the resulting composite was heated and pressed for 40 minutes by means of a hot press operating at 160°C and 40 kg/cm$^2$ to effect bonding. The resulting covered printed circuit board had the copper foil circuit portion completely embedded in a cover-lay coated with the present adhesive, and the adhesive did not exude to the exposed portion of the circular land, indicating satisfactory covering. The printed circuit neither failed at the boundary of the cover-lay when subjected to the attack of chemicals such as a flux at the time of soldering, nor suffers from rupture of the adhesive bond when subjected to flow soldering at the temperature of 270°C, indicating excellent heat resistance.

EXAMPLE 11

Two sheets of flexible printed circuits were prepared by the etching method by use of a copper-clad laminate with copper foil on one surface and a copper-clad laminate with copper foil on both surfaces, both laminates having been obtained in the same manner as in Example 1 and being polyimide film base. On the other hand, three polyimide films, 25 $\mu$ in thickness, were prepared, two of which were coated with the same adhesive as used in Example 2 each on one side, and the remainder was coated on both sides.

The film coated on both sides was used as an interlayer adhesive to bond the said sheet having a printed circuit on one side to the said sheet having printed circuits on both sides, and the films coated on one side were used as cover-lays to protect the surfaces of the obtained multi-layer circuit board.

The resulting assembly was heated and pressed for 60 minutes by means of a hot press operating at 150°C and at a pressure of 30 kg/cm$^2$ to obtain a flexible printed circuit board with 3 layers of circuits. It was found that the resulting printed circuit board had been perfectly bonded with interlayer adhesive of this invention and the circuits had been completely embedded. The adhesive layer was sufficiently resistant to chemicals such as plating chemicals for use in the preparation of the printed circuit. The board did not suffer from troubles such as blistering and delamination when soldered by means of a soldering iron heated at 300°C at its top-end during loading of parts on the circuits.

Table 1

| Item of test (unit) | Testing method | Treatment and conditions |
|---|---|---|
| Surface resistance ($\Omega$) | JIS C 6481 | A C-96/40/90 |
| Volume resistivity ($\Omega$-cm) | JIS C 6481 | A C-96/40/90 |
| Peel strength (kg-cm) | JIS C 6481 | A (direction, 180 degree) |
| Chemical resistance | JIS C 6481 | Immersion in trichloroethylene, acetone, and methylene chloride at room temperature for 15 minutes |
| Folding endurance of base board (number of foldings) | JIS P 8115 | *1 |
| Soldering heat-resistance (°C) | JIS C 6481 | Floated in a soldering bath for 30 seconds |

Note:
*1 Test specimen, 15 mm × 110 mm, was repeatedly folded over an edge, 0.8 mm radius of curvature, under a tensile load of 100 g/mm and number of foldings until the adhesive layer became cloudy or the base board ruptured was measured.

| Sample No. Base film | Example 1 | Example 2 | Example 3 | Example 4 | Example 5 | Example 6 | Example 7 |
|---|---|---|---|---|---|---|---|
|  | Polyimide | Polyamide imide | Polyimide | Polyethylene 2,6-naphthalate | Polyimide | Polyimide | Polyethylene terephthalate |
|  | 5 × 10$^{14}$ | 3 × 10$^{14}$ | 2 × 10$^{14}$ | 8 × 10$^{14}$ | 3 × 10$^{14}$ | 1 × 10$^{14}$ | 4 × 10$^{14}$ |
|  | 8 × 10$^{13}$ | 1 × 10$^{13}$ | 7 × 10$^{13}$ | 6 × 10$^{13}$ | 7 × 10$^{13}$ | 2 × 10$^{13}$ | 9 × 10$^{13}$ |
|  | 4 × 10$^{15}$ | 7 × 10$^{14}$ | 1 × 10$^{15}$ | 5 × 10$^{15}$ | 1 × 10$^{15}$ | 9 × 10$^{14}$ | 6 × 10$^{15}$ |
|  | 4 × 10$^{14}$ | 2 × 10$^{14}$ | 3 × 10$^{14}$ | 1 × 10$^{15}$ | 6 × 10$^{14}$ | 2 × 10$^{14}$ | 2 × 10$^{15}$ |
|  | 2.0 | 1.7 | 2.2 | 1.6 | 1.8 | 2.1 | 1.7 |

Table 1-continued

|  | Item of test (unit) | Testing method | Treatment and conditions | | | | Sample No. Base film |
|---|---|---|---|---|---|---|---|
| No change | No change | No change | No change | No change | No change | No change | No change |
| >1,000 | >1,000 | >1,000 | >1,000 | >1,000 | >1,000 | >1,000 | |
| 300°C | 280°C | 300°C | 260°C | 290°C | 290°C | 240°C | |
| No change | No change | No change | No change | No change | No change | No change | |

Table 2

| Item of test (unit) | Testing method | Treatment and conditions |
|---|---|---|
| Surface resistance ($\Omega$) | JIS C 6481 | A  C-96/40/90 |
| Volume resistivity ($\Omega$-cm) | JIS C 6481 | A  C-96/40/90 |
| Peel strength (kg-cm) | JIS C 6481 | A (direction, 180 degree) |
| Chemical resistance | JIS C 6481 | Immersion in trichloroethylene, acetone, and methylene chloride at room temperature for 15 minutes |
| Folding endurance of base board (number of foldings) | JIS P 8115 | *1 |
| Soldering heat-resistance (°C) | JIS C 6481 | Floated in a soldering bath for 30 seconds |

Note:
*1 Testing method was the same as in Table 1.

| Example 8 | Example 9 | Comparative Example 1 | Comparative Example 2 | Comparative Example 3 | Comparative Example 4 | Comparative Example 5 |
|---|---|---|---|---|---|---|
| Polyimide | Polyimide | Polyimide | Polyimide | Polyamide-imide | Polyimide | Polyimide |
| $6 \times 10^{14}$ | $8 \times 10^{14}$ | $2 \times 10^{11}$ | $3 \times 10^{13}$ | $2 \times 10^{13}$ | $4 \times 10^{12}$ | $8 \times 10^{13}$ |
| $8 \times 10^{13}$ | $1 \times 10^{14}$ | $5 \times 10^{9}$ | $3 \times 10^{12}$ | $4 \times 10^{12}$ | $5 \times 10^{11}$ | $6 \times 10^{12}$ |
| $5 \times 10^{15}$ | $7 \times 10^{15}$ | $3 \times 10^{12}$ | $2 \times 10^{14}$ | $8 \times 10^{13}$ | $3 \times 10^{13}$ | $9 \times 10^{14}$ |
| $9 \times 10^{14}$ | $7 \times 10^{14}$ | $5 \times 10^{10}$ | $1 \times 10^{13}$ | $9 \times 10^{12}$ | $6 \times 10^{12}$ | $3 \times 10^{13}$ |
| 1.8 | 1.9 | 0.9 | 1.5 | 1.2 | 1.0 | 1.6 |
| No change | No change | Swollen | No change | No change | No change | No change |
| >1,000 | >1,000 | >1,000 | >1,000 | 750 | 450 | >1,000 |
| 300°C | 300°C | 230°C | 270°C | 260°C | 230°C | 270°C |
| No change | No change | Delaminated | Blistered | Blistered | Delaminated | Blistered |

What is claimed is:

1. An adhesive composition for flexible printed circuits comprising a mixture of (1) a fusible and soluble phenol-formaldehyde resin, (2) a polyepoxy compound having at least two epoxy groups in its molecule, (3) at least one polymer selected from the group consisting of acrylonitrile-butadiene copolymers and polyvinylacetal resins, and (4) at least one copolymer selected from the group consisting of (a) partial alkyl esters of copolymers of aromatic vinyl compounds and maleic anhydride, (b) copolymers of aromatic vinyl compounds and alkyl maleates, and (c) copolymers of aromatic vinyl compounds, maleic anhydride, and alkyl maleates.

2. An adhesive composition for flexible printed circuits according to claim 1, wherein the mixture contains, in addition, at least one compound selected from the group consisting of derivatives of cyclohexenepolycarboxylic acids represented by the general formulas, E and F,

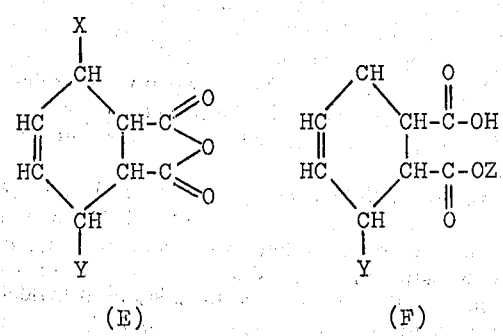

wherein X and Z are hydrogen atoms or alkyl groups having 1 to 10 carbon atoms and Y is hydrogen atom, carboxyl group, or a carboxyalkyl group having 2 to 11 carbon atoms.

3. An adhesive composition for flexible printed circuits according to claim 1, wherein the fusible and soluble phenol-formaldehyde resin is a resol-type phenol-formaldehyde resin obtained by using as catalyst at least one member selected from the group consisting of ammonia and amines.

4. An adhesive composition for flexible printed circuits according to claim 2, wherein the fusible and soluble phenol-formaldehyde resin is a resol-type phenol-formaldehyde resin obtained by using as catalyst at least one member selected from the group consisting of ammonia and amines.

5. An adhesive composition for flexible printed circuits according to claim 1, wherein the polyexpoxy compound having at least 2 epoxy groups in its molecule is a polyether-type diepoxy compound obtained by condensation reaction between an epihalohydrin and a dihydric alcohol formed from the addition reaction between a bisphenol and an alkylene oxide.

6. An adhesive composition for flexible printed circuits according to claim 2, wherein the polyepoxy compound having at least 2 epoxy groups in its molecule is a polyether-type diepoxy compound obtained by condensing an epihalohydrin with a dihydric alcohol formed from the addition reaction between a bisphenol and an alkylene oxide.

7. An adhesive composition for flexible printed circuits according to claim 1, wherein the acrylonitrile-butadiene copolymer is a high-nitrile copolymer containing 25 to 50% by weight of the acrylonitrile component.

8. An adhesive composition for flexible printed circuits according to claim 2, wherein the acrylonitrile-butadiene copolymer is a high-nitrile copolymer containing 25 to 50% by weight of the acrylonitrile component.

9. An adhesive composition for flexible printed circuits according to claim 1, wherein the polyvinyl-acetal resin is a partially acetalized product having a degree of acetalization of 50 to 80 mol percent.

10. An adhesive composition for flexible printed circuits according to claim 2, wherein the polyvinyl-acetal resin is a partially acetalized product having a degree of acetalization of 50 to 80 mol percent.

11. An adhesive composition for flexible printed circuits according to claim 1, wherein the mixing proportions of the components based on the total amount of the adhesive compositions are 5 to 50% by weight concerning the fusible and soluble phenol-formaldehyde resin, 5 to 70% by weight concerning the polyepoxy compound having at least 2 epoxy groups in its molecule, 5 to 60% by weight concerning the at least one polymer selected from the group consisting of acrylonitrile-butadiene copolymers and polyvinyl-acetal resins, and 5 to 50% by weight concerning the at least one copolymer selected from the group consisting of the copolymers (a), (b) and (c) as specified in claim 1.

12. An adhesive composition for flexible printed circuits according to claim 2, wherein the mixing proportions of the components based on the total amount of the adhesive composition are 5 to 50% by weight concering the fusible and soluble phenol-formaldehyde resin, 5 to 70% by weight concerning the polyepoxy compound having at least 2 epoxy groups in its molecule, 5 to 60% by weight concerning the at least one polymer selected from the group consisting of acrylonitrile-butadiene copolymers and polyvinyl-acetal resins, 5 to 50% by weight concerning the at least one copolymer selected from the group consisting of the copolymers (a), (b) and (c) as specified in claim 1, and 2 to 30% by weight concerning the at least one compound selected from the group consisting of derivatives of cyclohexenepolycarboxylic acids represented by the general formulas E and F.

13. A method for manufacturing a metal-clad laminate for flexible printed circuits, which comprises applying the adhesive composition according to claim 1 to a plastic film or a metal foil or both of them and bonding the plastic film to the metal foil by application of heat and pressure.

14. A method for manufacturing a metal-clad laminate for flexible printed circuits, which comprises interposing the adhesive composition according to claim 2 between a plastic film and a metal foil and bonding the latter two materials by application of heat and pressure.

15. A method for manufacturing a metal-clad laminate for flexible printed circuits, which comprises interposing the adhesive composition according to claim 1 between a polyimide film and a metal foil and bonding the film to the foil by application of heat and pressure.

16. A method for manufacturing a metal-clad laminate for flexible printed circuits, which comprises interposing the adhesive composition according to claim 2 between a polyimide film and a metal foil and bonding the film to the foil by application of heat and pressure.

17. A method for manufacturing a metal-clad laminate for flexible printed circuits, which comprises interposing the adhesive composition according to claim 1 between a polyamide-imide film and a metal foil and bonding the film to the foil by application of heat and pressure.

18. A method for manufacturing a metal-clad laminate for flexible printed circuits, which comprises interposing the adhesive composition according to claim 2 between a polyamide-imide film and a metal foil and bonding the film to the foil by application of heat and pressure.

19. A method for manufacturing a metal-clad laminate for flexible printed circuits, which comprises interposing the adhesive composition according to claim 1 between a plastic film and a metal foil, passing the resulting assembly between a pair of pressing rolls of a laminating equipment, one of the rolls being a metal roll and the other being a rubber roll, in such a manner that the plastic film and the metal foil contact with the metal roll and the rubber roll, respectively, and the metal foil is allowed to wrap around the rubber roll from the position on the circumference of the rubber roll for $\pi/4$ or more radians toward the contact line of both rolls, and effecting the bonding by application of heat and pressure while passing through said pair of pressing rolls.

20. A method for manufacturing a metal-clad laminate for flexible printed circuits, which comprises interposing the adhesive composition according to claim 2 between a plastic film and a metal foil, passing the resulting assembly between a pair of pressing rolls of a laminating equipment, one of the rolls being a metal roll and the other being a rubber roll, in such a manner that the plastic film and the metal foil contact with the metal roll and the rubber roll, respectively, and the metal foil is allowed to wrap around the rubber roll from the position on the circumference of the rubber roll for $\pi/4$ or more radians toward the contact line of both rolls, and effecting the bonding by application of heat and pressure while passing through said pair of pressing rolls.

21. A method for manufacturing a metal-clad laminate for flexible printed circuits, which comprises interposing the adhesive composition according to claim 11 between a plastic film and a metal foil, passing the resulting assembly between a pair of pressing rolls of a laminating equipment, one of the rolls being a metal roll and the other being a rubber roll, in such a manner that the plastic film and the metal foil contact with the metal roll and the rubber roll, respectively, and the metal foil is allowed to wrap around the rubber roll from the position on the circumference of the rubber roll for $\pi/4$ or more radians toward the contact line of both rolls, and effecting the bonding by application of heat and pressure while passing through said pair of pressing rolls.

22. A method for manufacturing a metal-clad laminate for flexible printed circuits, which comprises interposing the adhesive composition according to claim 12 between a plastic film and a metal foil, passing the resulting assembly between a pair of pressing rolls of a laminating equipment, one of the rolls being a metal roll and the other being a rubber roll, in such a manner that the plastic film and the metal foil contact with the metal roll and the rubber roll, respectively, and the metal foil is allowed to wrap around the rubber roll from the position on the circumference of the rubber roll for $\pi/4$ or more radians toward the contact of both rolls, and effecting the bonding by application of heat and pressure while passing through said pair of pressing rolls.

23. A metal-clad laminate for flexible printed circuits obtained by the method according to claim 15.

24. A metal-clad laminate for flexible printed circuits obtained by the method according to claim 16.

25. A metal-clad laminate for flexible printed circuits obtained by the method according to claim 17.

26. A metal-clad laminate for flexible printed circuits obtained by the method according to claim 18.

27. A method according to claim 19, wherein the plastic film is a polyimide film.

28. A method according to claim 20, wherein the plastic film is a polyimide film.

29. A metal-clad laminate for flexible printed circuits obtained by any of the methods according to claim 13.

30. A metal-clad laminate for flexible printed circuits obtained by any of the methods according to claim 14.

* * * * *